United States Patent
Antaya et al.

(10) Patent No.: US 12,439,524 B2
(45) Date of Patent: Oct. 7, 2025

(54) OBJECT SENSOR INCLUDING A DEPOSITED HEATER AND METHOD OF FORMING SAME

(71) Applicant: Aptiv Technologies AG, Schaffhausen (CH)

(72) Inventors: Stephen C. Antaya, West Kingston, RI (US); M. Jarod Scherer, Wakefield, RI (US); Claudia Schulz, Nuremberg (DE); Michael E. Wheaton, W. Warwick, RI (US)

(73) Assignee: ANTAYA TECHNOLOGIES CORPORATION, Warwick, RI (US)

( * ) Notice: Subject to any disclaimer, the term of this patent is extended or adjusted under 35 U.S.C. 154(b) by 0 days.

(21) Appl. No.: 18/127,156

(22) Filed: Mar. 28, 2023

(65) Prior Publication Data
US 2023/0240015 A1    Jul. 27, 2023

Related U.S. Application Data

(63) Continuation of application No. 16/140,740, filed on Sep. 25, 2018, now abandoned.

(51) Int. Cl.
*C09D 11/52* (2014.01)
*C03C 17/00* (2006.01)
(Continued)

(52) U.S. Cl.
CPC ......... *H05K 3/1216* (2013.01); *C03C 17/009* (2013.01); *C03C 17/34* (2013.01);
(Continued)

(58) Field of Classification Search
CPC ........ H05K 3/1216; C09D 11/52; H05B 3/86; H05B 2203/013; H05B 2203/017;
(Continued)

(56) References Cited

U.S. PATENT DOCUMENTS 4,786,784 A * 11/1988 Nikodem .......... B32B 17/10761
219/203
4,958,560 A    9/1990 Collins
(Continued)

FOREIGN PATENT DOCUMENTS

CN         110635240 A      12/2019
EP         0939580 A2       9/1999
(Continued)

OTHER PUBLICATIONS https://digital-library.theiet.org/content/books/10.1049/sbcs502e_ch4, Nathan Ida, IET Digital Library, p. 1, abstract, lines 1-2 (Year: 2013).*

(Continued)

*Primary Examiner* — Tiffany T Tran
(74) *Attorney, Agent, or Firm* — Billion & Armitage

(57) ABSTRACT

A sensor device includes an emitter configured to emit radiation a detector configured to detect radiation reflected from an object and a cover having an interior surface facing the emitter or detector and allowing the radiation to pass through the cover. The sensor device also includes a heater with a wire-like trace directly deposited on the interior surface of the cover formed of a fluid comprising an electrically conductive material that was deposited onto a portion of the cover and cured. The heater has an electrically conductive connector pad formed with the heater by directly depositing and curing the fluid comprising the electrically conductive material directly on the interior surface of the cover simultaneously with forming the heater. The heater is positioned and arranged to sufficiently heat the cover while not blocking an area through which radiation must pass for proper operation of the emitter and the detector.

5 Claims, 4 Drawing Sheets

(51) Int. Cl.
  *C03C 17/34* (2006.01)
  *H01B 1/22* (2006.01)
  *H05B 3/12* (2006.01)
  *H05B 3/18* (2006.01)
  *H05B 3/28* (2006.01)
  *H05B 3/86* (2006.01)
  *H05K 3/12* (2006.01)

(52) U.S. Cl.
  CPC .............. *C09D 11/52* (2013.01); *H01B 1/22* (2013.01); *H05B 3/12* (2013.01); *H05B 3/18* (2013.01); *H05B 3/286* (2013.01); *H05B 3/86* (2013.01); *H05B 2203/013* (2013.01); *H05B 2203/017* (2013.01); *H05B 2214/02* (2013.01)

(58) Field of Classification Search
  CPC  H05B 2214/02; H05B 2203/003; H05B 3/84; H05B 3/20; H05B 3/845; H05B 3/12; H05B 3/18; H05B 3/286; G01S 7/02; G01S 7/481; G01S 7/4004; G01S 7/4043; G01S 7/497; G01S 2007/4975; G01S 2013/93271; B41M 1/12; C03C 17/009; C03C 17/34; H01B 1/22
  USPC .......................................................... 219/203
  See application file for complete search history.

(56) References Cited

U.S. PATENT DOCUMENTS

| | | | |
|---|---|---|---|
| 5,388,509 A | 2/1995 | Cutcher | |
| 6,559,419 B1* | 5/2003 | Sol ........................... | H05B 3/84 52/171.2 |
| 6,674,392 B1 | 1/2004 | Schmidt et al. | |
| 7,202,445 B2 | 4/2007 | Yamada | |
| 9,476,706 B2 | 10/2016 | Nakajima et al. | |
| 9,625,685 B2 | 4/2017 | Ogawa et al. | |
| 2002/0005941 A1* | 1/2002 | Kawaguchi .............. | G01C 3/08 356/4.01 |
| 2004/0159645 A1 | 8/2004 | Gillner et al. | |
| 2004/0167717 A1 | 8/2004 | Buchanan et al. | |
| 2006/0001727 A1* | 1/2006 | Haas .................. | A41D 13/0051 347/194 |
| 2006/0060576 A1 | 3/2006 | Haas et al. | |
| 2006/0086710 A1 | 4/2006 | Meiler et al. | |
| 2006/0186104 A1* | 8/2006 | Winter .............. | B32B 17/10036 219/203 |
| 2008/0099456 A1 | 5/2008 | Schwenke et al. | |
| 2009/0321407 A1* | 12/2009 | Dixon .............. | B32B 17/10036 219/203 |
| 2010/0032421 A1* | 2/2010 | Martinez .................. | H05B 3/84 219/520 |
| 2010/0219173 A1* | 9/2010 | Gruber .................. | B60S 1/0848 219/203 |
| 2011/0114631 A1* | 5/2011 | Dammura ................ | H05B 3/86 156/280 |
| 2014/0070054 A1 | 3/2014 | Burton et al. | |
| 2014/0354462 A1 | 12/2014 | Shi | |
| 2015/0029487 A1* | 1/2015 | Nakajima ............. | G01S 17/931 356/4.01 |
| 2015/0343744 A1 | 12/2015 | Ogawa et al. | |
| 2018/0170314 A1 | 6/2018 | Paule et al. | |
| 2019/0150229 A1 | 5/2019 | Lau et al. | |
| 2019/0279793 A1 | 9/2019 | Takayoshi et al. | |
| 2019/0389429 A1 | 12/2019 | Chiba et al. | |

FOREIGN PATENT DOCUMENTS

| | | | | |
|---|---|---|---|---|
| EP | 1605729 A2 | 12/2005 | | |
| EP | 1605729 A3 | 9/2007 | | |
| EP | 1605729 B1 | 7/2018 | | |
| GB | 2091529 A | 7/1982 | | |
| GB | 2372927 A | * 9/2002 | ........... | H05B 1/0236 |
| JP | 6036359 U | 3/1985 | | |
| JP | 2003518634 A | 6/2003 | | |
| JP | 3117480 U | 1/2006 | | |
| JP | 2006194639 | 7/2006 | | |
| JP | 2006194639 A | 7/2006 | | |
| JP | 2009117292 A | 5/2009 | | |
| JP | 2009523084 A | 6/2009 | | |
| JP | 2017018884 A | 1/2017 | | |
| JP | 2017215242 A | 12/2017 | | |
| JP | 2018505383 A | 2/2018 | | |
| KR | 100945258 B1 | 3/2010 | | |
| WO | 03011607 A1 | 2/2003 | | |
| WO | 2019030106 A1 | 2/2019 | | |

OTHER PUBLICATIONS

Japanese Notice of Allowance for JP Application No. 2019169181, dated Jan. 7, 2022, 4 pages.
Japanese Office Action for JP Application No. 2019169181, dated Feb. 26, 2021, 5 pages.
Japanese Office Action, JP App No. 2019-169181, dated Sep. 25, 2020, 3 pages.
Korean Office Action for KR Application No. 10-2019-0115798, dated Jun. 29, 2021, 4 pages.
Notice of Preliminary Rejection for Korean Application No. 10-2019-0115798, 9 pages.
"Communication of a Notice of Opposition" mailed on Nov. 14, 2022, 26 Pages.
"Decision to Grant" received for Korean Patent Application No. 10-2021-0124576, mailed on Jan. 17, 2023, 5 pages.
"First Office Action Received" mailed on Feb. 1, 2023, 25 Pages.
"Notice of Preliminary Rejection" mailed on Oct. 24, 2022, 3 Pages.

* cited by examiner

OBJECT SENSOR INCLUDING A DEPOSITED HEATER AND METHOD OF FORMING SAME

CROSS-REFERENCE TO RELATED APPLICATION

This application claims benefit of priority to U.S. patent application Ser. No. 16/140,740 filed on Sep. 25, 2018, the entire disclosure of which is hereby incorporated by reference.

BACKGROUND

Advances in electronics and technology have made it possible to incorporate a variety of advanced features on automotive vehicles. Various sensing technologies have been developed for detecting objects in a vicinity or pathway of a vehicle. Such systems are useful for detecting objects in the pathway or vicinity of a vehicle for parking assist and cruise control adjustment features, for example.

More recently, automated vehicle features have become possible to allow for autonomous or semi-autonomous vehicle control. For example, cruise control systems may incorporate RADAR or light detection and ranging (LIDAR) for detecting an object or another vehicle in the pathway of a vehicle. Depending on the approach speed, the cruise control setting may be automatically adjusted to reduce the speed of the vehicle based on detecting another vehicle in the pathway of the vehicle.

While RADAR and LIDAR systems have proven useful, including them on vehicles is not without challenges. Some environmental conditions can interfere with the ability to get a reliable reading from the device. For example, ice or snow may build up or condensation may form on the cover in amounts that reduce or block the radiation otherwise emitted from the detector or the radiation that is reflected back toward the detector. The small size of the detectors and the thin cover material make it challenging to include a heater for reducing or removing ice, snow or condensation.

SUMMARY

An illustrative example method of making a sensor device including a cover covering at least one of an emitter and a detector includes establishing a heater on the cover by depositing a fluid comprising an electrically conductive material onto a portion of the cover and curing the deposited electrically conductive material.

In an example embodiment having one or more features of the method of the previous paragraph, the cover has an interior surface facing the at least one of the emitter and detector and the method comprises depositing the fluid comprising the electrically conductive material onto the interior surface.

In an example embodiment having one or more features of the method of any of the previous paragraphs, the depositing comprises screen printing.

In an example embodiment having one or more features of the method of any of the previous paragraphs, the depositing comprises robotically controlling a flow of the fluid and a pattern of the fluid on the portion of the cover.

In an example embodiment having one or more features of the method of any of the previous paragraphs, the cover comprises a plurality of layers and the portion of the cover comprises one of the layers.

In an example embodiment having one or more features of the method of any of the previous paragraphs, one of the layers comprises glass or polycarbonate, another one of the layers comprises a thin film substrate, and the method comprises depositing the fluid onto the thin film substrate and adhesively securing the thin film substrate to the one of the layers.

In an example embodiment having one or more features of the method of any of the previous paragraphs, the plurality of layers comprises two layers that comprise glass or polycarbonate, and the method includes depositing the fluid onto a surface of one of the two layers, positioning the surface of the one of the two layers to face toward another of the two layers, and laminating the two layers together with the heater between the two layers.

In an example embodiment having one or more features of the method of any of the previous paragraphs, the curing comprises heating the electrically conductive material.

In an example embodiment having one or more features of the method of any of the previous paragraphs, the cover comprises glass and the heating comprises heating the cover and the electrically conductive material in a firing furnace.

An example embodiment having one or more features of the method of any of the previous paragraphs includes forming at least one electrically conductive connector pad on the cover by depositing some of the fluid comprising the electrically conductive material onto the cover in a pad configuration.

An example embodiment having one or more features of the method of any of the previous paragraphs includes establishing the heater and forming the at least one connector pad simultaneously.

An illustrative example embodiment of a sensor device includes an emitter configured to emit radiation. A detector is configured to detect radiation reflected off an object. A cover covers at least one of the emitter and the detector and allows the radiation to pass through the cover. A heater comprises at least one conductor formed onto a portion of the cover from a fluid comprising an electrically conductive material that was deposited onto the portion of the cover and cured.

In an example embodiment having one or more features of the sensor device of the previous paragraph, the cover has an interior surface facing the at least one of the emitter and the detector and the portion of the cover including the heater is on the interior surface.

In an example embodiment having one or more features of the sensor device of any of the previous paragraphs, the heater comprises a wire-like trace comprising the electrically conductive material.

In an example embodiment having one or more features of the sensor device of any of the previous paragraphs, the electrically conductive material comprises silver.

In an example embodiment having one or more features of the sensor device of any of the previous paragraphs, the heater comprises at least one electrically conductive connector pad, the at least one connector pad is made of the electrically conductive material, and the electrically conductive material of the at least one connector pad was deposited in fluid form onto the cover and cured.

An example embodiment having one or more features of the sensor device of any of the previous paragraphs includes at least one conductive wire having an end soldered to the at least one connector pad.

In an example embodiment having one or more features of the sensor device of any of the previous paragraphs, the electrically conductive material comprises silver and the at least one connector pad comprises silver.

In an example embodiment having one or more features of the sensor device of any of the previous paragraphs, the cover comprises a plurality of layers, one of the layers comprises at least one of glass and polycarbonate, another one of the layers comprises a thin film substrate secured to the one of the layers, and the portion of the cover comprises the thin film substrate.

In an example embodiment having one or more features of the sensor device of any of the previous paragraphs, the cover comprises a plurality of layers, the plurality of layers comprises two layers that comprise glass or polycarbonate, the heater is on one surface of one of the two layers that faces toward another of the two layers, and the two layers are laminated together with the heater are situated between the two layers.

The various features and advantages of at least one disclosed example embodiment will become apparent to those skilled in the art from the following detailed description. The drawings that accompany the detailed description can be briefly described as follows.

DETAILED DESCRIPTION

Figure 1:
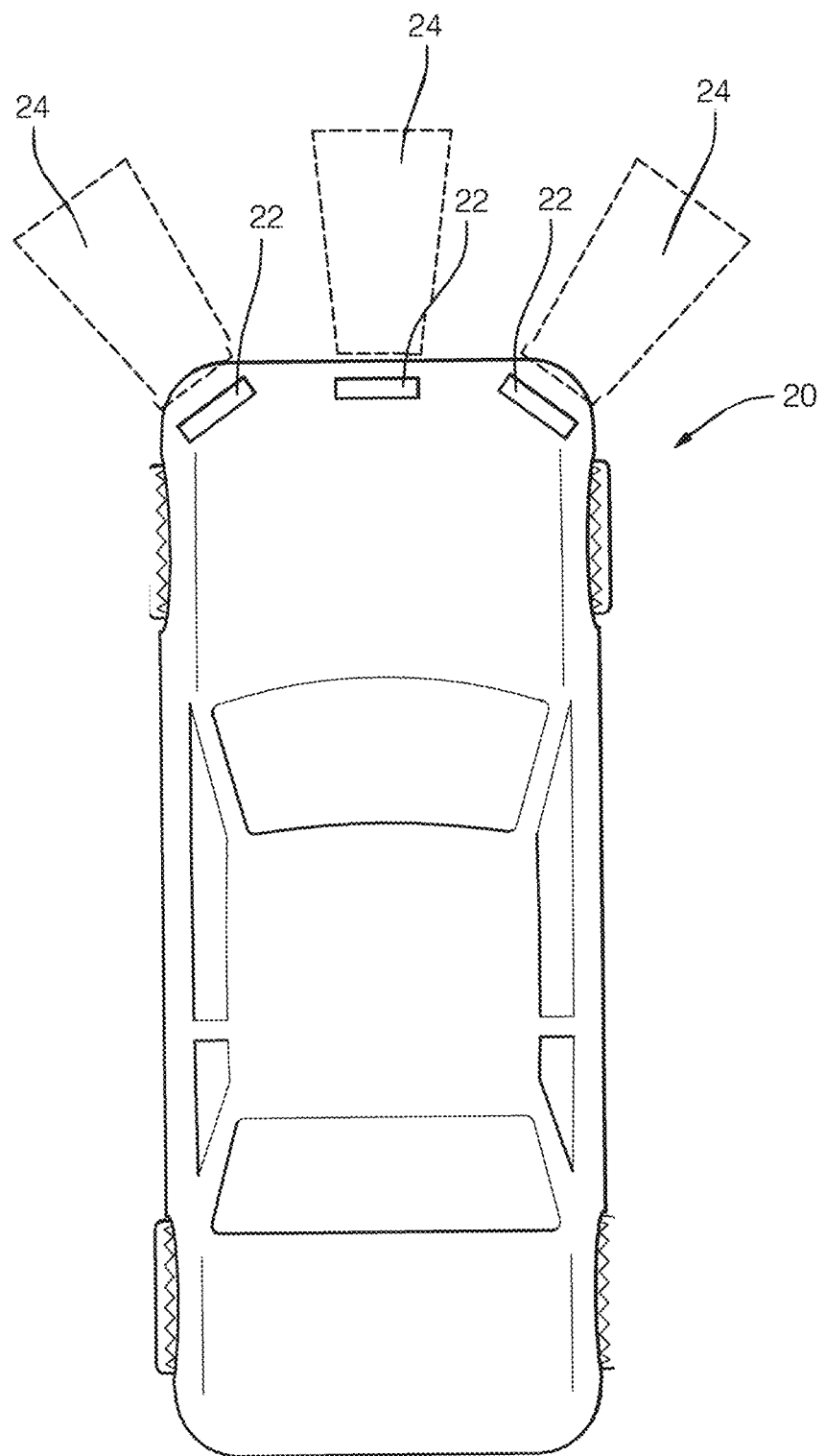
FIG. 1 schematically illustrates a vehicle including a sensor device designed according to an embodiment of this invention.

FIG. 1 schematically illustrates a vehicle 20 including sensor devices 22 that are useful for detecting an object in a vicinity of the vehicle 20. The sensor devices 22 respectively have detecting fields represented at 24 to allow for selectively determining or approximating a distance to a detected object and a relationship between an object and the vehicle 20, such as a rate at which the vehicle is approaching an object. In some embodiments the sensor devices 22 are RADAR devices. In other embodiments the sensor devices 22 are LIDAR devices.

Figure 2:
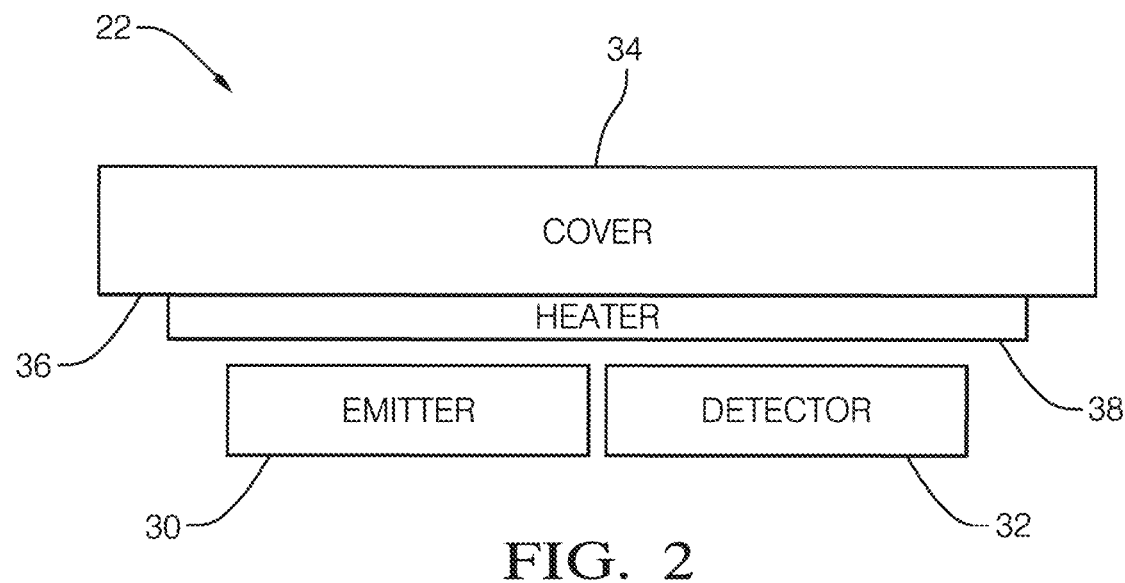
FIG. 2 schematically illustrates selected features of a sensor device designed according to an embodiment of this invention.

FIG. 2 schematically illustrates selected features of the sensor devices 22. At least one emitter 30 emits radiation into the corresponding detecting field 24. At least one detector 32 detects radiation reflected from an object in the corresponding detecting field 24. A single emitter 30 and a single detector 32 are shown for discussion purposes. Example embodiments include multiple emitters and multiple detectors within a sensor device 22.

A cover 34 covers the emitter 30 and the detector 32 in this example. The cover 34 has an interior surface 36 facing toward the emitter 30 and the detector 32. The cover 34 is transparent to the radiation used for detecting objects such that the cover 34 does not interfere with radiation emitted by the emitter 30 or reflecting from an object and traveling back toward the detector 32.

For situations or conditions that may allow for ice, snow or condensation to build up or form on the cover 34, a heater 38 is provided on a portion of the cover 34. In this embodiment the heater 38 is situated on the interior surface 36 of the cover 34. Providing the heater 38 on the interior surface protects the heater 38 from environmental conditions that may otherwise compromise the operation or effectiveness of the heater 38. Another feature of having the heater 38 on the interior surface 36 is that the exterior of the cover 34 can be heated when desired without reaching a temperature that would be too hot for an individual to touch. This is useful, for example, when the cover 34 is situated where the cover is exposed to potential contact.

Figure 3:
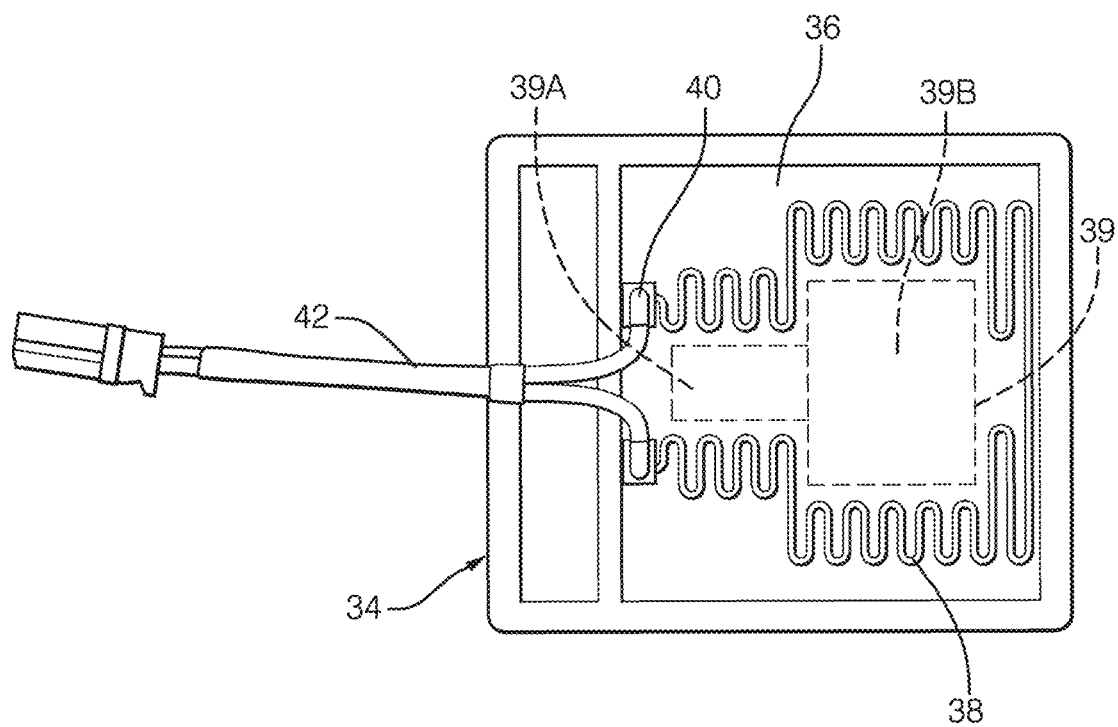
FIG. 3 schematically illustrates an example heater configuration on an example cover designed according to an embodiment of this invention.

The heater 38 is situated on the interior surface 36 where the heater 38 will not interfere with radiation passing through the cover 34 from the emitter 30 or toward the detector 32. As shown in FIG. 3, the heater 38 comprises a wire-like trace of electrically conductive material on the interior surface 36 of the cover 34. The position and arrangement of the heater 38 provides enough surface contact to sufficiently heat the cover 34 while not blocking the first zone 39A or the second zone 39B of the area 39 through which radiation must pass for proper operation of the emitter 30 and the detector 32.

A fluid comprising the electrically conductive material of the heater 38 is deposited onto the interior surface 36 of the cover 34 and then cured to solidify the electrically conductive material and secure the heater 38 to the cover 34.

An example electrically conductive material comprises silver, which has material characteristics that are amenable to screen printing and other fluid deposition techniques. Silver also has characteristics that provide reliable heater performance over time. The cover 34 comprises glass or polycarbonate in many embodiments and silver is compatible with each when deposited onto the cover 34.

The example heater 38 includes electrically conductive connector pads 40 that also comprise silver in this embodiment. The connector pads 40 in this example are screen printed or otherwise deposited onto the interior surface 36 of the cover 34. The connector pads 40 are formed simultaneously with forming or establishing the heater 38 in some embodiments. Silver connector pads 40, which may be pre-fluxed, allow for soldering ends or leads of conductors 42, such as wires, to the connector pads 40. In some embodiments, the leads or terminals that are secured to the connector pads 40 are pre-fluxed and attached to the pads 40. The conductors 42 provide the necessary power for operating the heater 38 when needed.

One feature of the illustrated embodiment is that the heater 38 has a higher power per unit size compared to heating elements provided on vehicle windows such as rear defrosters. The heater 38 is capable of warming the cover 34 quickly to ensure reliable operation of the sensor device 22. The electrical resistance of the heater 38, which corresponds to its heating capacity, can be controlled by selecting different electrically conductive materials, for example.

Embodiments of this invention avoid a need to imbed a wire into the substrate of the cover 34, which can be problematic. For example, screen printing the heater 38 in place provides superior control over the position, size and configuration of the heater 38 on the cover 34 compared to a process of imbedding a wire. Additionally, there are no cover distortion or external appearance issues when incorporating a deposited heater 38 on the cover 34. The cover 34 is typically too thin to imbed a wire without protrusions or causing distortion to the shape and appearance of the cover. Additionally, once a wire is imbedded it becomes difficult to make an electrically conductive connection. The soldered connections with the deposited connector pads 40 are easier to make and do not present any distortion or appearance issues.

Figure 4:
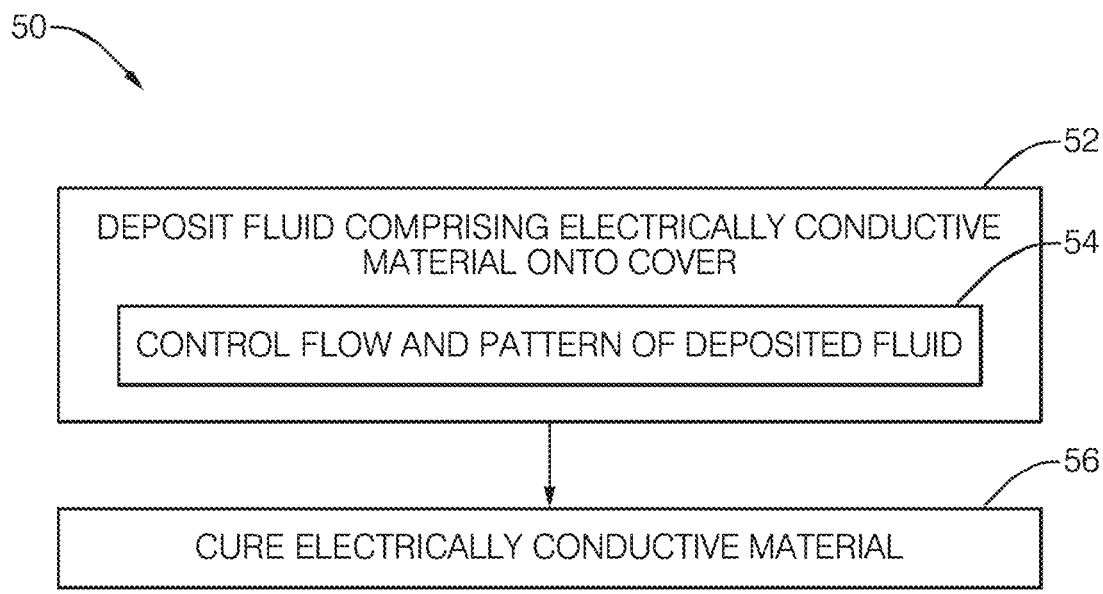
FIG. 4 is a flow chart diagram summarizing an example method according to an embodiment of this invention.

FIG. 4 summarizes an example approach to establishing the heater 38 on the cover 34 in a flow chart 50. At 52 the fluid comprising the electrically conductive material is deposited onto the selected portion of the cover 34. At least one conductive connector pad 40 is formed also while depositing the electrically conductive material at 52. In this example, the fluid is deposited directly onto the interior surface 36 of the cover 34. At 54, the flow and pattern of the fluid are controlled to achieve the desired heater configuration and placement on the cover 34. In some-example embodiments the fluid is screen printed onto the cover 34. In other embodiments, the fluid flow and pattern are robotically controlled as the fluid is deposited onto the cover 34. At 56 the electrically conductive material is cured to secure the heater 38 to the cover 34. In some examples, such as those that include glass as the material of the cover 34, the cover and the deposited conductive material are heated in a firing furnace to secure the heater 38 to the cover 34. In other embodiments that include other cover materials, such as polycarbonate, curing occurs at a lower temperature to avoid damage to or distortion of the cover material.

Figure 7:
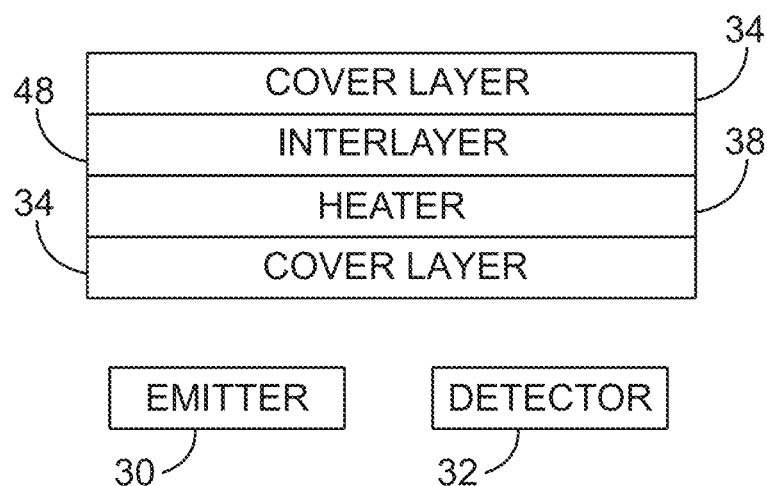
FIG. 7 schematically illustrates yet another example heater configuration on an example cover designed according to an embodiment of this invention.

Another embodiment shown in FIG. 7 includes laminating two cover layers 34 together. Each of the layers 34 comprises glass or polycarbonate. The fluid comprising the electrically conductive material is deposited onto a surface of one of the layers that is positioned to face toward the other of the two layers. The layers 34 are laminated together with the heater 38 between the layers. Some laminated embodiments include a vinyl interlayer 48 between the two cover layers 34 that comprise glass or polycarbonate.

Figure 5:
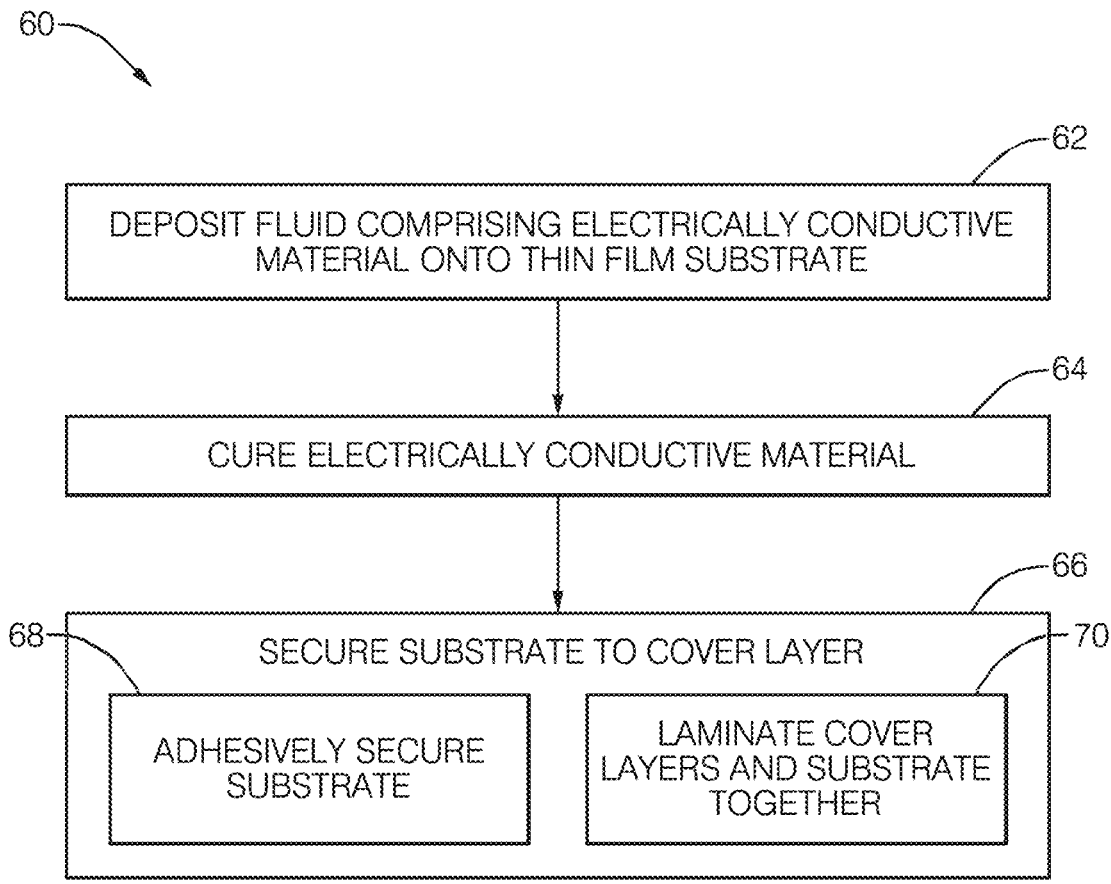
FIG. 5 is a flow chart diagram summarizing another example method.
Figure 6:
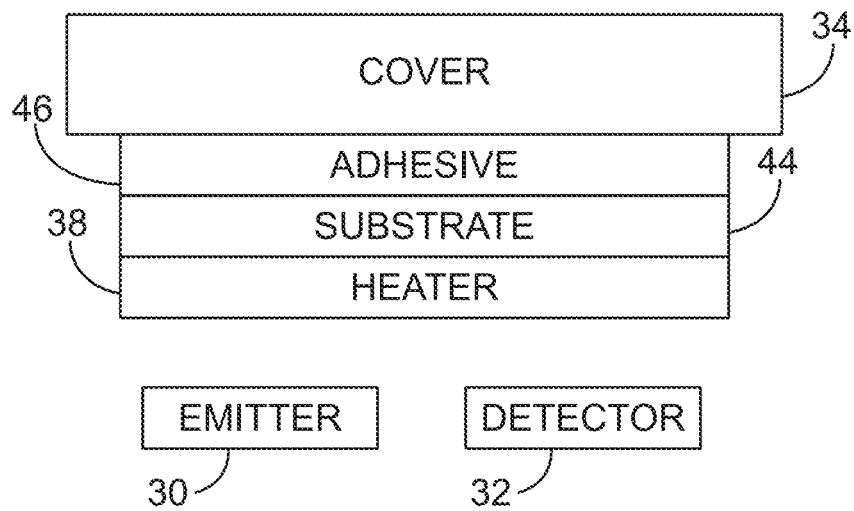
FIG. 6 schematically illustrates another example heater configuration on an example cover designed according to an embodiment of this invention.

FIG. 5 includes a flowchart 60 that summarizes another example approach. In this case, the cover 34, shown in FIG. 6, comprises a plurality of layers. The fluid comprising the electrically conductive material is deposited onto a thin film substrate 44 at 62. The deposition process may include screen printing or robotic deposition. Curing the conductive material, which was deposited in the form of the heater 38 and the connector pads 40, occurs at 64. The substrate 44 becomes one of the layers of the cover 34 in this example.

The substrate 44 supporting the heater 38 is then secured to at least one layer of the cover 34 at 66. As shown at 68 securing the substrate 44 to the cover layer is accomplished by adhesively securing the substrate 44 to the cover layer. In some embodiments the adhesive 46 is a part of the substrate 44 while in others a separate adhesive 44 applied between the substrate and the cover layer secures the substrate 44 and heater 38 in place.

As shown at 70 some embodiments include laminating two layers of cover material together with the substrate between those layers. This approach effectively encases the heater 38 within the material of the cover 34. One feature of the laminating approach at 70 compared to the adhesive-based approach at 68 is that laminating the layers together provides increased thermal conductivity between the heater 38 and the material of the cover 34.

In any of the example laminated embodiments, the connection for powering or controlling the heater 38 can be made with a conductive foil inserted into the laminate. Another option is to include a cut-out in one of the laminated layers with the connector pad 40 at least partially exposed by the cut-out.

The examples described above provide improved heater configurations for sensor or detector covers, such as those used for RADAR or LIDAR. The application of a conductive material in fluid form allows for achieving desired heater configurations and performance while avoiding the difficulties associated with attempting to imbed a wire on the cover.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

The invention claimed is:

1. A method of making a sensor, comprising:
establishing a heater on an interior surface of a cover of the sensor device the cover by forming a wire-like trace on the interior surface by depositing a fluid comprising an electrically conductive material directly onto the interior surface of the cover, forming at least one electrically conductive connector pad on the cover by depositing some of the fluid comprising the electrically conductive material directly onto the interior surface of the cover in a pad configuration simultaneously with forming the heater, and curing the deposited electrically conductive material; and
positioning and arranging the cover over an emitter configured to emit radiation and a detector configured to detect the radiation reflected off an object, such that the heater surrounds a contiguous area of the cover, through which the radiation must pass for proper operation of the emitter and the detector, the contiguous area comprising a first zone and a second zone, the first zone having a first length and a first width that is shorter than a second length and a second width of the second zone.

2. The method of claim 1, wherein the two layers comprise glass or polycarbonate.

3. A sensor device, comprising:
an emitter configured to emit radiation;
a detector configured to detect the radiation reflected from an object;
a cover covering the emitter and the detector, the cover configured to allow the radiation to pass through the cover; and
a heater comprising a wire-like trace directly deposited on the interior surface of the cover formed by a fluid comprising an electrically conductive material that was deposited onto a portion of the cover and cured, wherein the heater comprises at least one electrically conductive connector pad formed with the heater by directly depositing and curing the fluid comprising the electrically conductive material directly on the interior surface of the cover simultaneously with forming the heater and wherein the heater is positioned and arranged to provide surface contact to surround a contiguous area of the cover through which radiation must pass for proper operation of the emitter and the detector, the contiguous area comprising a first zone and a second zone, the first zone having a length and a width that is shorter than the second zone.

4. The sensor device of claim 3, wherein the electrically conductive material comprises silver.

5. The sensor device of claim 3, wherein the two layers comprise glass or polycarbonate.

* * * * *

UNITED STATES PATENT AND TRADEMARK OFFICE
CERTIFICATE OF CORRECTION

PATENT NO. : 12,439,524 B2
APPLICATION NO. : 18/127156
DATED : October 7, 2025
INVENTOR(S) : Stephen C. Antaya et al.

It is certified that error appears in the above-identified patent and that said Letters Patent is hereby corrected as shown below:

In the Claims

Column 6, Claim 1, "A method of making a sensor, comprising: establishing a heater on an interior surface of a cover of the sensor device the cover by forming a wire-like trace on the interior surface by depositing a fluid comprising an electrically conductive material directly onto the interior surface of the cover, forming at least one electrically conductive connector pad on the cover by depositing some of the fluid comprising the electrically conductive material directly onto the interior surface of the cover in a pad configuration simultaneously with forming the heater, and curing the deposited electrically conductive material; and positioning and arranging the cover over an emitter configured to emit radiation and a detector configured to detect the radiation reflected off an object, such that the heater surrounds a contiguous area of the cover, through which the radiation must pass for proper operation of the emitter and the detector, the contiguous area comprising a first zone and a second zone, the first zone having a first length and a first width that is shorter than a second length and a second width of the second zone."
Should read --A method of making a sensor, comprising: establishing a heater on an interior surface of a cover of the sensor device by forming a wire-like trace on the interior surface by depositing a fluid comprising an electrically conductive material directly onto the interior surface of the cover, forming at least one electrically conductive connector pad on the cover by depositing some of the fluid comprising the electrically conductive material directly onto the interior surface of the cover in a pad configuration simultaneously with forming the heater, and curing the deposited electrically conductive material; and positioning and arranging the cover over an emitter configured to emit radiation and a detector configured to detect the radiation reflected off an object, such that the heater surrounds a contiguous area of the cover, through which the radiation must pass for proper operation of the emitter and the detector, the contiguous area comprising a first zone and a second zone, the first zone having a first length and a first width that is shorter than a second length and a second width of the second zone.--

Signed and Sealed this
Third Day of February, 2026

John A. Squires
*Director of the United States Patent and Trademark Office*